METHOD OF MAKING CATHODE RAY TUBE SCREENS

Filed Dec. 13, 1956

INVENTORS:
MARTHA A. BEELER,
MORGAN E. GAGER,

BY Nathan Lomford[signature]

THEIR ATTORNEY.

United States Patent Office 2,992,919

Patented July 18, 1961

2,992,919

METHOD OF MAKING CATHODE RAY TUBE SCREENS

Martha A. Beeler and Morgan E. Gager, Syracuse, N.Y., assignors to General Electric Company, a corporation of New York Filed Dec. 13, 1956, Ser. No. 628,063

2 Claims. (Cl. 96—35)

This invention relates to improvements in a method of making cathode ray tube screens wherein the target material of the screen consists of a plurality of different materials, such as different luminescent phosphors, arranged to occupy different respective areas in a particular pattern. The invention has particular utility in connection with the forming of multiple-phosphor screens for color television picture tubes, wherein a plurality of different phosphors adapted to produce light of different respective colors are arranged with precision on different respective elemental areas of the screen.

One known method of making multiple-phosphor cathode ray tube screens involves coating the tube faceplate or other screen substrate member with a photo-sensitive resist to which phosphor can adhere, projecting optically onto the resist the desired pattern of a particular phosphor, applying the particular phosphor to the resist, developing the resist so as to remove the portions thereof other than those corresponding to the desired pattern, and repeating the sequence as necessary to apply each of the other desired phosphors. With the different phosphors thus applied to respective desired areas of the screen support member, the screen may be aluminized, if desired, and the remaining resist is driven off by a suitable high-temperature bakeout.

One of the problems in making a plural-phosphor patterned screen of this type according to a method such as that above described arises from the fact that any one phosphor may adhere to the resist or substrate not only in the areas where it is desired, but also in areas intended for or already occupied by other phosphors, and hence contamination of one phosphor by another will result. It will be readily understood that when the different phosphors are intended to emit light of different respective colors, as in screens of color television picture tubes, such contamination of one phosphor by another can result in color impurities in the picture which are, of course, highly objectionable.

Accordingly, a principal object of the present invention is to provide an improved method for forming cathode ray tube screens of the type having a plurality of target materials differing in various properties such as physical, chemical, electrical or the like, and arranged on different respective areas of the screen in a particular pattern, by which method contamination of one target material by another is substantially eliminated.

Another object is to provide an improved method for forming cathode ray tube screens having a plurality of individual phosphor portions arranged to occupy different respective areas in a particular pattern, and whereby the phosphor portions are positioned and sized with improved accuracy and the borders of the phosphor portions are delineated with enhanced sharpness and smoothness.

These and other objects of the invention will be apparent from the following description and the scope of the invention will be defined in the appended claims.

Briefly, according to the present invention, contamination of one target material by another is prevented by temporarily covering each applied target material with a protective film prior to the application of the next target material. The film provides a surface to which the next coating of resist can adhere, but is impervious to subsequently applied resist and target material, and can dissolve away readily with the extraneous portions of resist without disturbing retained portions of resist. Hence the protective film remains in place as a protective covering over each applied target material during the application of the next target material, and thereby positively prevents intermingling and contamination of one target material by another. The protective coating is maintained only temporarily while additional respective target materials are being applied to the screen, and is then completely removed automatically during later stages of screen processing, leaving each target material of the screen fully unmasked yet uncontaminated by its neighbors.

Figure 1:
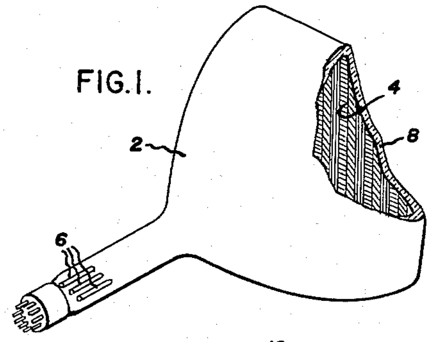
FIGURE 1 is a partly broken away view of one form of cathode ray tube to which the present invention is particularly applicable.

Referring to FIGURE 1, the cathode ray tube there shown is a color television picture tube and includes an evacuated envelope 2 containing a screen or layer of target material 4 and one or more electron guns 6, here shown for example as three in number, arranged to excite the screen. In the tube shown the screen 4 consists of a phosphor layer deposited on a foundation or support member 8 which in the present instance consists of the interior surface of the faceplate portion of envelope 2. A thin coating of conductive material, not shown, may be provided adjacent one surface of the screen. The phosphor layer consists of a plurality of different individual phosphors, each occupying different respective areas on support member 8. The phosphors may be characterized as differing in respect to various properties, those in the present embodiment differing with respect to the color of light which they emit when excited by incident electrons. The different phosphors may be arranged in any desired pattern, those in the screen shown being arranged, by way of example, in groups, with each group covering an elemental area of the screen and consisting of a narrow stripe of each of the different respective phosphors.

Turning now to FIGURES 2 through 9 of the drawing, formation of a screen for a tube of the type shown in FIGURE 1 in accordance with the present invention will now be described. The surface of the screen support member 8 is first covered with a suitable photosensitive resist to which target material, in this case phosphor, can adhere, and on which the pattern of a set of phosphor elements of one light-emitting color may be conveniently impressed by exposure to light rays. One such resist which is known to be satisfactory for this purpose is polyvinyl alcohol suitably sensitized with ammonium or potassium dichromate. The resist is preferably applied to support member 8 as a solution of which the solvent is evaporable. A suitable resist solution may consist, for example, of 3 to 7 parts by weight of polyvinyl alcohol, obtainable commercially as "Elvanol" 52–22, to 100 parts of water, 40 to 70 parts of ethyl alcohol, and ¼ to 3 parts of ammonium dichromate.

Figure 2:
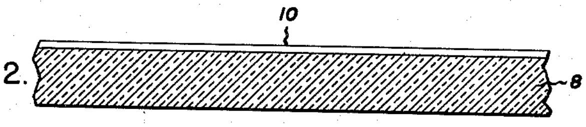
FIGURES 2 through 9 illustrate, to an enlarged and exaggerated scale, successive steps in the screen making method of the present invention.

The resist solution is coated over the screen support member 8, the excess solution drained off, and the remainder dried sufficiently to secure it in place. Drying with circulating room temperature air for several minutes, for example, has been found to be quite satisfactory. During the drying process the alcohol and water are evaporated and the resist is reduced to a film 10 on the screen support member 8 as shown in FIGURE 2.

Figure 3:
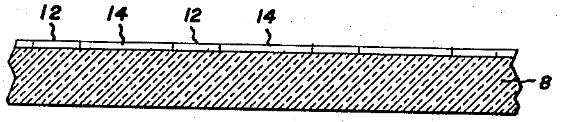

The resist is then exposed to light rays in a pattern corresponding to the desired pattern of the areas to be occupied by one type of phosphor, i.e. the pattern of those phosphor elements of the various groups which emit light of a particular color, e.g. blue. The exposure renders the polyvinyl alcohol in the areas exposed relatively insoluble in water, and thus the pattern of the blue phosphor elements is in effect written into the resist, as shown in FIG. 3, in the form of relatively water-insoluble areas 12 surrounded by soluble areas 14.

Figure 4:
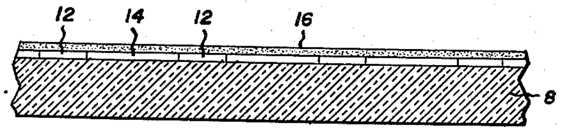

After exposure of the resist the particular phosphor whose pattern was exposed, in this case blue, is applied directly to the film 10, as by coating film 10 with a slurry 16 consisting of particles of the blue phosphor in a suitable vehicle, as shown in FIGURE 4. One suitable slurry, for example, may be made by combining one part of a solution identical with the resist solution hereinbefore described, except that the dichromate sensitizer is preferably omitted, with one part ethyl alcohol and one part phosphor. The slurry overcoating 16 is then dried, as by means of circulating room temperature air for several minutes, and the phosphor particles therein become attached to and are retained by the underlayer of resist.

Figure 5:
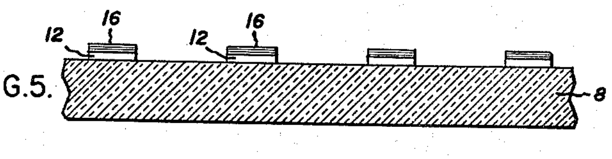

The resist 10 is then developed by washing with water to remove the unexposed portions 14 together with the portions of phosphor layer 16 superposed thereon, leaving only the exposed and hence insolubilized portions 12 of the resist together with the portions of phosphor layer 16 superposed thereon. While the temperature of the wash water for removing the unexposed polyvinyl alcohol is not critical, we have found that it is preferable to use relatively cool water for this purpose, e.g. in the temperature range of 10 to 25° C. to avoid loosening of any of the exposed polyvinyl alcohol. After the developing process is completed there remains the pattern of the original exposure written in insolubilized resist 12 and attached phosphor 16, as shown in FIG. 5. The screen is then dried to fix the elements of blue phosphor 16 securely in place.

Various alternatives to the sequence of steps above described will be readily apparent to those skilled in the art. For example the phosphor or other target material may be applied to the resist 10 before exposure, or the phosphor and resist may be applied simultaneously in a single coating, or the phosphor may be sprayed, dusted, or otherwise applied to the resist. The final result of such alternatives is the same, however, namely the formation of a desired pattern written in an embossed or three-dimensional image consisting of target material and associated resist to which the target material is attached, and therefore it should be understood that the present invention is no limited to any specific sequence of steps by which any single target material and its associated resist is applied to the foundation member 8.

Figure 6:
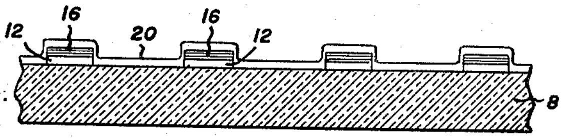

The above described sequence of steps may then be repeated as necessary to apply the next respective phosphor, e.g. that emitting light of the color green. Before the screen support member 8 is again coated with resist, however, in accordance with the present invention a temporary protective barrier coating or film is laid over the elements of the already applied blue phosphor 16. Conveniently the barrier coating may be applied as a single continuous film 20, as shown in FIG. 6, covering not only elements 16, but also the uncovered portions of support member 8 as well. This barrier coating 20 prevents the subsequently-to-be applied resist and/or phosphor elements from coming in contact with and contaminating either the already-applied phosphor 16, or areas of member 8 later to be occupied by other phosphors. The coating must consist of a material which will adhere to member 8 and already-applied phosphor, and to which a superimposed layer of resist will satisfactorily adhere, and it must remain intact and impervious to subsequently applied resist as a protective barrier during the application of the next phosphor and the exposure and selective removal thereof. A preferred protective coating which has been found to give excellent results in this regard consists of gelatin, i.e. the combination of amino acid residues derived from animal proteins and otherwise known as collagen, preferably applied as a weak water solution. The exact strength of the gelatin solution is not critical, but a solution of 1 to 10% by weight has been found to give very goods results and is preferred.

A satisfactory gelatin solution may be made, for example, by sprinkling powdered gelatin, U.S.P grade, into deionized warm water, i.e. 40–45° C. Optionally and preferably, a small amount of dichromate sensitizer, for example up to 0.4% by weight of ammonium dichromate, may be added to the gelatin-water solution. The gelatin solution is then applied to the screen by flow-coating, draining off the excess solution, and drying with circulating room temperature air for several minutes. Optionally and preferably, the screen may be wetted slightly with water before application of the gelatin solution, or a suitable wetting agent may be added to the gelatin solution to enhance its wetting ability.

Figure 7:
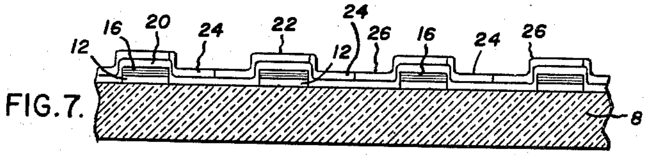

After the protective film 20 is dry, the next coating of photo-sensitive resist 22 may be applied to member 8, dried, and exposed to form relatively insoluble areas 24 and soluble areas 26 as shown in FIGURE 7. Phosphorizing with the second or green phosphor 28 may then be carried out in the manner heretofore described for the blue phosphor. The application of the protective barrier layer 20 to the first-applied blue phosphor 16 protects it from contamination from stray elements of green phosphor 28 and also insures that the green phosphor will not be contaminated by any stray particles of blue phosphor which might be loosened during the coating and developing steps involved in applying the green phosphor. The barrier layer 20 further protects the still vacant areas of member 8 from contamination by green phosphor 28 or undesired resist. Thus not only does the barrier film prevent intermixing of different target materials such as to undesirably change their chosen characteristics, in this case the colors of their light output, but also the film prevents any physical agglomeration of target materials which would undesirably impair the sharpness of their borders or the accuracy of size or location of the target material elements.

The exposed resist 22, phosphorized with green phosphor, is then developed by washing with water. The water wash may be performed in two steps, the first step consisting of washing with relatively cool water, e.g. in the temperature range of 10 to 25° C. This removes the relatively soluble portions 26 of resist 22, together with the portions of green phosphor superposed thereon, but does not appreciably dissolve the protective film 20. Thus the blue phosphor 16 and the protected areas of support member 8 remain safely covered by protective film 20 during removal of the unwanted portions of green phosphor, thereby preserving the blue phosphor and member 8 in a contamination free state. The screen is then dried, or at least the excess liquid drained therefrom, and then washed again, preferably with warm water, e.g. in the temperature range of 35–50° C. and dried.

Figure 8:
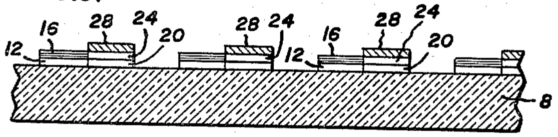
Figure 9:
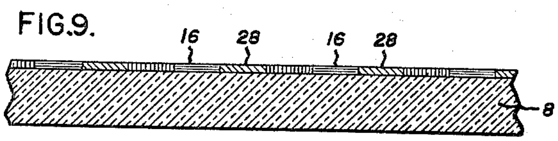

If the barrier film 20 is composed of gelatin photosensitized with dichromate, the developing operation may be performed alternatively with only a single washing step, in warm water, e.g. 35 to 50° C. Whether one-step or two-step developing is used, however, the warm water wash effectively removes the unprotected portions of the gelatin film 20 overlying the blue phosphor 16 and vacant areas of support member 8, leaving member 8 uncontaminated and leaving the blue phosphor elements fully unmasked for optimum efficiency and with their borders cleanly and sharply delineated. Thus there remains, as shown in FIGURE 8, the green phosphor elements 28 arranged in the desired pattern and attached to insolubilized portions of resist 24 underlaid with barrier film 20, and the blue phosphor elements 16 arranged in the desired pattern and attached to insolubilized portions of resist 12.

After drying of the screen, the above sequence of steps involved in applying the green phosphor may be repeated as many times as necessary to apply any desired number of additional phosphors, the application of the successive coatings of resist being preceded in each case by application of a protective barrier film as described to each phosphor element already applied and to any exposed areas of support member 8.

After all of the different desired phosphors have been applied, the screen may be overlaid with a suitable conducting layer, such as aluminum, if desired, and any remaining portions of resist or of the protective films 20, 22 etc. may be removed by subjecting the screen to a suitable bake-out or heat treatment, for example by baking at 800–900° F. for a few hours.

Thus it may be seen that according to the present invention the protective barrier film interposed between successively deposited target materials positively prevents intermixing and contamination of one target material by another, yet is completely removed automatically during later stages of screen processing, leaving the respective target materials fully unmasked for optimum efficiency and with borders accurately positioned and sharply defined.

It will be appreciated by those skilled in the art that the invention may be carried out in various ways and may take various forms and embodiments other than those illustrative embodiments heretofore described. For example, while the invention has been described in connection with a multiple phosphor, plural color light output screen for a color television picture tube, it will be understood that the invention is not so limited, but is generally applicable to the prevention of contamination between target materials differing in various properties such as physical properties, chemical, electrical, and the like. It is therefore to be understood that the scope of the invention is not limited by the details of the foregoing description, but will be defined in the following claims.

What we claim as new and desire to secure by Letters Patent of the United States is:

1. The method of making a cathode ray tube target of the type having a plurality of different target materials arranged to occupy different respective areas in a particular pattern comprising the steps of coating a support member with a layer of a photo-sensitive resist having a water solubility varying in accordance with exposure thereof to light, photo-exposing and thereby rendering selected areas of said layer of resist relatively insoluble, applying a first target material to at least the relatively insoluble areas of the resist, subjecting to dissolution in water and thereby removing the relatively soluble portions of resist together with any of the first target material attached thereto, covering at least the retained portions of target material with a temporary resist-impervious protective film of gelatin having substantially less solubility in water of a temperature of 10 to 25° C. than said resist, applying to the support member and over the temporary protective film an additional layer of said photo-sensitive resist, photo-exposing and rendering relatively insoluble selected areas of said additional resist, applying a second target material to at least the relatively insoluble areas of said additional resist, removing the relatively soluble portions of said additional resist together with any second target material attached thereto by dissolution with water having a temperature of 10 to 25° C., and removing the temporary protective gelatin film from the target material covered thereby by dissolution in water having a temperature of 35 to 50° C.

2. The method of making a cathode ray tube screen of the type having a plurality of different luminescent phosphors arranged to occupy different respective areas in a particular pattern comprising the steps of coating a support member with a layer of a photo-sensitive resist having a water solubility varying in accordance with exposure thereof to light and comprising dichromate-sensitized polyvinyl alcohol, photo-exposing and thereby rendering selected areas of the resist relatively insoluble, applying a first phosphor to at least the relatively insoluble areas of said resist, subjecting to dissolution in water and thereby removing the relatively soluble portions of resist together with any of the first phosphor attached thereto, covering at least the retained portions of first phosphor with a film of gelatin having substantially less solubility in water of a temperature of 10 to 25° C. than said resist, drying said film, applying to the support member and over the gelatin film an additional layer of said photo-sensitive resist, photo-exposing and rendering relatively insoluble selected areas of said additional layer of resist, applying a second phosphor to at least the relatively insoluble areas of said additional layer of resist, subjecting to dissolution in relatively cool water having a temperature of 10–25° C. and thereby removing the relatively soluble portions of said additional layer of resist together with any second phosphor attached thereto, subjecting to dissolution in relatively warm water having a temperature of 35–50° C. and thereby removing the gelatin from the phosphor covered thereby, and repeating the last-mentioned seven steps for each other phosphor.

References Cited in the file of this patent

UNITED STATES PATENTS

| | | |
|---|---|---|
| 679,501 | Garchey | July 30, 1901 |
| 1,265,641 | Foerster | May 7, 1918 |
| 2,590,018 | Koller et al. | Mar. 18, 1952 |
| 2,756,167 | Barnett | July 24, 1956 |
| 2,767,457 | Epstein | Oct. 23, 1956 |
| 2,840,470 | Levine | June 24, 1958 |
| 2,900,255 | Charlton | Aug. 18, 1959 |

OTHER REFERENCES

Wall: History of Three-Color Photography (1925), pp. 456, 483.